United States Patent
Yuasa et al.

(10) Patent No.: US 6,646,609 B2
(45) Date of Patent: Nov. 11, 2003

(54) ANTENNA WITH AN INTEGRAL RF CIRCUIT, ANTENNA MODULE INCORPORATING THE SAME, AND COMMUNICATION APPARATUS INCORPORATING THE SAME

(75) Inventors: Atsuyuki Yuasa, Sagamihara (JP); Kazunari Kawahata, Machida (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/189,424

(22) Filed: Jul. 8, 2002

(65) Prior Publication Data

US 2003/0030587 A1 Feb. 13, 2003

(30) Foreign Application Priority Data

Aug. 7, 2001 (JP) .................................. 2001-239303

(51) Int. Cl.⁷ ................................................. H01Q 1/38
(52) U.S. Cl. ................................ 343/700 MS; 343/846
(58) Field of Search ..................... 343/700 MS, 846, 343/848, 853; H01Q 1/38

(56) References Cited

U.S. PATENT DOCUMENTS 6,211,825 B1 * 4/2001 Deng .................. 343/700 MS
6,320,543 B1 * 11/2001 Ohata et al. ......... 343/700 MS
6,518,932 B1 * 2/2003 Matsui et al. ............... 343/770

* cited by examiner

Primary Examiner—Hoanganh Le
(74) Attorney, Agent, or Firm—Keating & Bennett, LLP

(57) ABSTRACT

An antenna with an integral RF circuit includes a dielectric base, a plurality of radiation electrodes disposed on a top surface of the dielectric base and a plurality of RF circuits. The RF circuits include circuit patterns disposed partially in a gap between the radiation electrodes. On a bottom surface of the dielectric base, a concavity is formed in a region corresponding to where the circuit patterns are located. The circuit patterns are disposed on a thin portion of the dielectric base, associated with the concavity, while the radiation electrodes are disposed on thick portions thereof. Accordingly, radiation loss of the circuit patterns is reduced, and the radiation electrodes favorably transmit or receive radio waves. The antenna with an integral RF circuit is constructed efficiently using the gap between the radiation electrodes to define the RF circuits. Reduction in the size of a communication apparatus is facilitated because the RF circuits need not be disposed on a circuit board thereof.

18 Claims, 6 Drawing Sheets a communication apparatus including
such an antenna.

ANTENNA WITH AN INTEGRAL RF CIRCUIT, ANTENNA MODULE INCORPORATING THE SAME, AND COMMUNICATION APPARATUS INCORPORATING THE SAME

BACKGROUND OF THE INVENTION

1. Field of the Invention

The present invention relates to an antenna with an integral RF circuit that can be mounted on a circuit board of a communication apparatus, an antenna module including such an antenna, and a communication apparatus including such an antenna.

2. Description of the Related Art

In recent years, reduction in the sizes of communication apparatuses such as on-vehicle communication apparatuses and portable communication apparatuses have been demanded, and thus, reduction in the sizes of antennas have also been demanded. Accordingly, surface-mount antennas, that is, chip antennas that can be mounted on a circuit board of a communication apparatus, have been actively researched and developed. In the surface-mount antennas, for example, radiation electrodes for transmitting or receiving radio waves are disposed on a dielectric base.

For example, a plurality of radiation electrodes is disposed on a dielectric base so that radio waves in a plurality of frequency bands can be transmitted or received by a single surface-mount antenna. When a plurality of radiation electrodes is disposed on the same dielectric base as described above, the dielectric constant of the dielectric base, which is a factor that contributes to reduction in size, strengthens coupling between the radiation electrodes. Thus, a large space is required between the radiation electrodes in order to ensure isolation between the radiation electrodes, leading to an increase in the size of an antenna. The increase in the size of the antenna prevents a reduction in the size of a communication apparatus.

SUMMARY OF THE INVENTION

In order to overcome the problems described above, preferred embodiments of the present invention provide an antenna with an integral RF circuit that readily facilitates reduction in the size of a communication apparatus, an antenna module including such a novel antenna, and a communication apparatus including such a novel antenna.

According to a preferred embodiment of the present invention, an antenna with an integral RF circuit includes a dielectric base, a top surface thereof being substantially flat, a plurality of radiation electrodes for one of or both transmission and reception of a radio wave, disposed on the top surface of the dielectric base and spaced from each other, an integral RF circuit having a circuit pattern and connected to at least one of the plurality of radiation electrodes conductively or via a capacitor, the FR circuit being disposed at least partially in a gap between the radiation electrodes, a concavity formed in a bottom surface of the dielectric base in a region corresponding to an area where the circuit pattern of the RF circuit is located, the concavity defining a thin portion and a thick portion in the dielectric base, the circuit pattern of the RF circuit being disposed on the thin portion of the dielectric base and the plurality of radiation electrodes being disposed on the thick portion of the dielectric base, and a ground electrode disposed on the bottom surface of the dielectric base and on an inner surface of the concavity.

The plurality of radiation electrodes preferably has different resonant frequencies from each other.

Furthermore, the plurality of radiation electrodes disposed on the top surface of the dielectric base preferably includes at least one radiation electrode dedicated for reception and at least one radiation electrode dedicated for transmission.

Furthermore, the RF circuit is preferably provided in one-to-one association with each of the plurality of radiation electrodes.

Another preferred embodiment of the present invention provides an antenna module including an antenna with the integral RF circuit described above, the antenna module being joined with a substrate with a bottom surface defining a connecting surface, a circuit conductively connected to the RF circuit of the antenna with the integral RF circuit and disposed in an area on the substrate surrounded by the concavity on the bottom surface of the antenna with the integral RF circuit, and a connecting device for conductively connecting the circuit and the RF circuit.

The connecting device may include a through hole formed in the dielectric base of the antenna with the integral RF circuit.

Alternatively, the connecting device may include a wiring pattern disposed on a side surface of the dielectric base of the antenna with an integral RF circuit.

Also alternatively, the connecting device may include a metallic pin disposed so as to penetrate through the dielectric base of the antenna with an integral RF circuit from the top surface to the bottom surface.

According to yet another preferred embodiment of the present invention, a communication apparatus includes an antenna with the integral RF circuit described above or an antenna module described above.

According to preferred embodiments of the present invention, a plurality of radiation electrodes are spaced from each other on a top surface of a dielectric base, and an integral RF circuit is arranged so as to be disposed at least partially in a gap between the radiation electrodes. Because the RF circuit is thus arranged on the dielectric base to efficiently utilize the gap between the plurality of radiation electrodes, any increase in the size of the dielectric base is prevented, and the RF circuit and the plurality of radiation electrodes can be disposed on the dielectric base.

Furthermore, because the RF circuit is disposed in the antenna, the RF circuit need not be disposed on a circuit board of a communication apparatus, allowing the circuit board to be made much smaller which allows for significant reduction in the size of the communication apparatus.

Furthermore, by providing the radiation electrodes on a thick portion of the dielectric base, the radiation electrodes resonate favorably, so that performance of transmission or reception of radio waves is greatly improved. Furthermore, by disposing a circuit pattern on a thin portion of the dielectric base, an electric field of the circuit pattern is confined, thereby greatly reducing radiation loss attributed to radiation of radio waves from the circuit pattern. Furthermore, compared with a case where a plurality of radiation electrodes is disposed on a uniformly thick dielectric base as shown in FIG. 7A, by making a portion of the dielectric base between the radiation electrodes thin with a concavity as shown in FIG. 7B, coupling between the radiation electrodes is diminished. Furthermore, another circuit can be disposed and included within the concavity.

According to preferred embodiments of the present invention, a plurality of radiation electrodes are arranged so as to be spaced from each other on a substantially flat top surface of a dielectric base, and an integral RF circuit is arranged at least partially in a gap between the radiation electrodes. Accordingly, the radiation electrodes are separated from each other by such a space where the RF circuit is located, so that isolation between the radiation electrodes is ensured. Furthermore, a portion of the dielectric base between the radiation electrodes is made thin because of the formation of the concavity, so that coupling between the radiation electrodes is minimized. This also contributes to ensure isolation between the radiation electrodes.

Furthermore, when a plurality of radiation electrodes is disposed in parallel, a gap between the radiation electrodes has conventionally been a dead space and has not been utilized. However, according to preferred embodiments of the present invention, the gap between the radiation electrodes is efficiently used to provide an integral RF circuit. Accordingly, even if an integral RF circuit is disposed on a dielectric base, an increase in the size of the dielectric base is prevented thereby preventing any increase in cost.

Furthermore, because an integral RF circuit is disposed on a dielectric base of an antenna, the RF circuit need not be provided on a circuit board of a communication apparatus, allowing the circuit board to be made smaller, thereby facilitating reduction in the size of the communication apparatus.

Furthermore, because radiation electrodes and RF circuits are disposed on the same surface and disposed in proximity to each other, conduction paths for signals between the radiation electrodes and the RF circuits are extremely short, thereby significantly reducing conduction loss.

Furthermore, according to preferred embodiments of the present invention, because radiation electrodes are disposed on a thick portion of a dielectric base, the radiation electrodes favorably transmit or receive radio waves. Furthermore, because a circuit pattern of an integral RF circuit is disposed on a thin portion of the dielectric base, an electric field of the circuit pattern is confined, thereby reducing radiation loss of the circuit pattern. Due to the effect of reducing radiation loss of the circuit pattern and the effect of reducing conduction loss, loss is significantly reduced in an antenna according to preferred embodiments of the present invention, so that sensitivity for transmission or reception is improved. Accordingly, reliability of communication using an antenna with an integral RF circuit, an antenna module, or a communication apparatus is greatly improved.

Furthermore, in an arrangement in which a plurality of radiation electrodes has different resonant frequencies from each other, isolation between the radiation electrodes is greatly improved.

Furthermore, in an antenna module including an antenna with an integral RF circuit according to preferred embodiments of the present invention, a space formed with a concavity of a dielectric base of the antenna with an integral RF circuit is efficiently used to dispose therein a circuit connected to an integral RF circuit. That is, the circuit is disposed within the antenna. Thus, the circuit within the antenna need not be disposed on a circuit board of a communication apparatus, allowing the circuit board to be made smaller accordingly, further facilitating reduction in the size of the communication apparatus.

In an arrangement in which a through hole is provided or a wiring pattern is disposed on a side surface of a dielectric base of an antenna with an integral RF circuit for connecting an integral RF circuit disposed on a top surface of the dielectric base and a circuit disposed within the antenna, the RF circuit of the antenna and the circuit disposed on a substrate can be conductively connected simply by joining the antenna with an integral RF circuit with the substrate, thereby improving efficiency of assembly. Furthermore, in an arrangement in which a metallic pin is used as connecting member, reliability of connection between an integral RF circuit and a circuit on a substrate is improved.

Other features, elements, advantages and characteristics of the present invention will become more apparent from the following detailed description of preferred embodiments thereof with reference to the attached drawings.

DETAILED DESCRIPTION OF PREFERRED EMBODIMENTS

Preferred embodiments of the present invention will now be described with reference to the accompanying drawings.

Figure 1A:
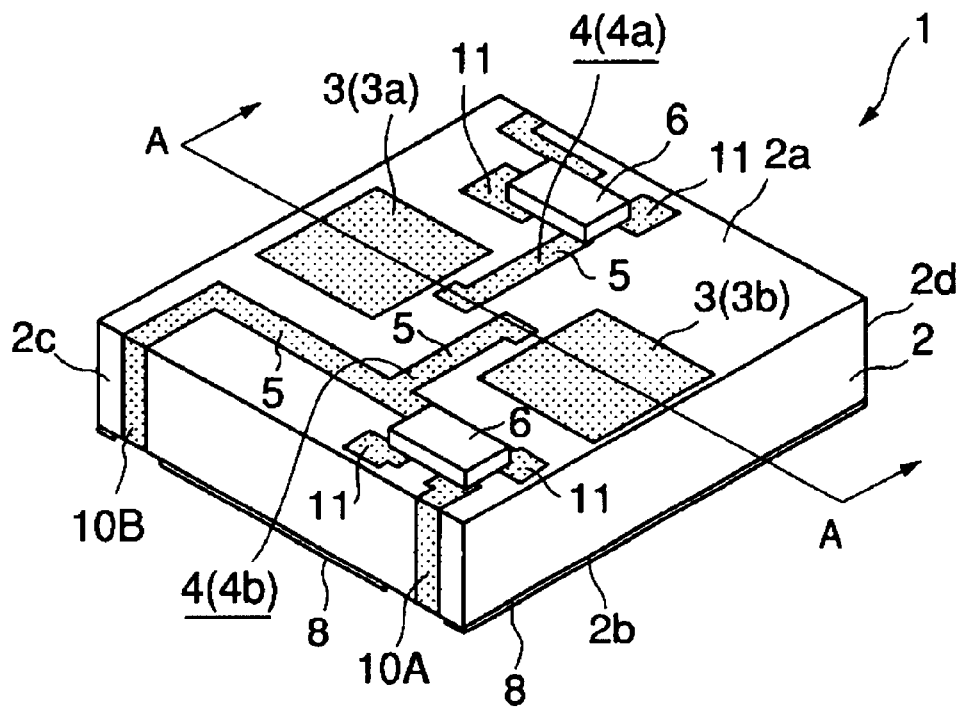
FIGS. 1A and 1B are diagrams showing an antenna with an integral RF circuit according to a first preferred embodiment of the present invention.
Figure 1B:
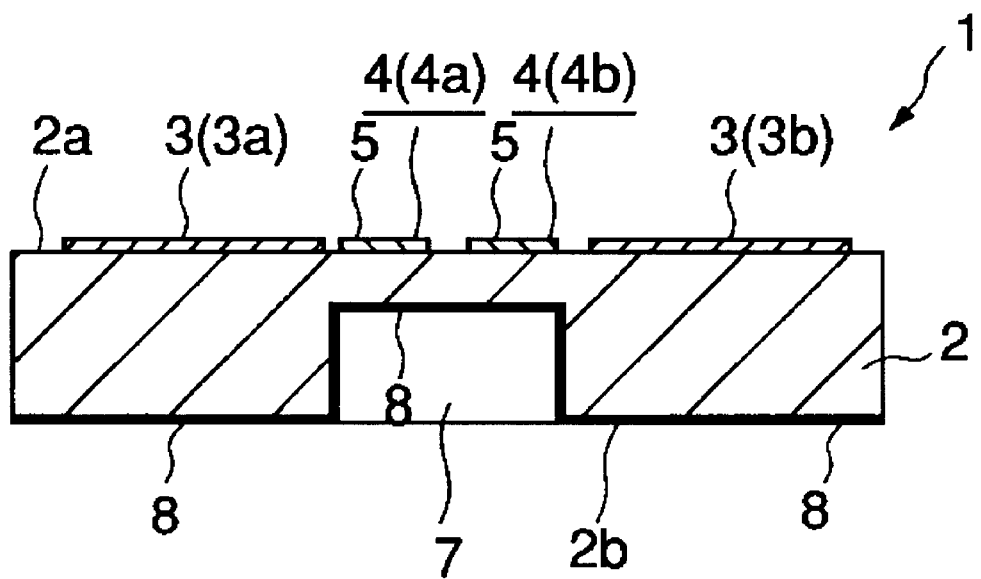

FIG. 1A schematically shows an antenna with an integral RF circuit, which characterizes a radio apparatus according to a first preferred embodiment, and FIG. 1B shows a schematic sectional view taken along line A—A in FIG. 1A. There exist various constructions of a radio apparatus, and in the first preferred embodiment, the radio apparatus, except for the antenna with the integral RF circuit, which will be described below, may use any construction, and description of the construction of the radio apparatus, except for the antenna with the integral RF circuit, will be omitted herein.

An antenna 1 with an integral RF circuit, according to the first preferred embodiment, includes a dielectric base 2. A top surface 2a of the dielectric base 2 preferably is a substantially flat surface without concavities and convexities. On the top surface 2a of the dielectric base 2, a plurality of radiation electrodes 3 (3a and 3b) is arranged to be spaced from each other. In the first preferred embodiment, the radiation electrodes 3a and 3b preferably have different resonant frequencies from each other. For example, the radiation electrode 3a on one side is dedicated for reception and the radiation electrode 3b on the other side is dedicated for transmission.

Furthermore, on the top surface 2a of the dielectric base 2, an integral RF circuit 4 (4a) associated with the radiation electrode 3a and an integral RF circuit 4 (4b) associated with the radiation electrode 3b are disposed. In the first preferred embodiment, the RF circuits 4a and 4b include matching circuits constituted of circuit patterns 5, and also include circuit components (e.g., switching elements such as FETs) 6. The circuit pattern 5 of each of the RF circuits 4a and 4b is arranged so as to be disposed partially in a gap between the radiation electrodes 3a and 3b, the circuit pattern 5 of the RF circuit 4a being connected to the radiation electrode 3a and the circuit pattern 5 of the RF circuit 4b being connected to the radiation electrode 3b each via a capacitor.

Furthermore, in the first preferred embodiment, on a side surface 2c of the dielectric base 2, wiring patterns 10A and 10B for connecting the RF circuit 4b to external circuits are provided. Similarly, on a side surface 2d of the dielectric base 2, opposite to the side surface 2c, a wiring pattern (not shown) for connecting the RF circuit 4a to an external circuit is provided.

On a bottom surface 2b of the dielectric base 2, a concavity 7 is formed in a region corresponding to an area where the circuit patterns 5 of the RF circuits 4a and 4b are formed. That is, in the first preferred embodiment, a thin portion and thick portions are formed in the dielectric base 2 due to the concavity 7. The circuit patterns 5 are disposed on a top surface of the thin portion of the dielectric base 2, while the radiation electrodes 3a and 3b are respectively disposed on the thick portions of the dielectric base 2.

Furthermore, a ground electrode 8 is disposed substantially over the entire bottom surface 2b of the dielectric base 2 and inner surface of the concavity 7. In the first preferred embodiment, the portion where the circuit patterns 5 are provided is constructed in the form of a laminate unit including a ground member, a dielectric member, and a conductor pattern, thus defining a microstrip line structure.

The antenna 1 with an integral RF circuit, according to the first preferred embodiment, is preferably constructed as described above. The antenna 1 with an integral RF circuit is surface-mounted, for example, on a circuit board of a communication apparatus, with the bottom surface 2b of the dielectric base 2 defining a mounting surface. Thus, for example, the wiring pattern 10A of the antenna 1 with the integral RF circuit is conductively connected to a transmission circuit disposed on the circuit board, while the wiring pattern 10B is connected to a bias portion of the circuit board. Furthermore, the wiring pattern on the side surface 2d of the dielectric base 2 is conductively connected to a reception circuit on the circuit board.

When a signal to be transmitted is supplied from the transmission circuit on the circuit board to the radiation electrode 3b via the wiring pattern 10A and via the circuit component 6 and the circuit pattern 5 (matching circuit) of the RF circuit 4b, the radiation electrode 3b resonates, radiating a radio wave. When the radiation electrode 3a receives a radio wave, a corresponding reception signal is transferred to the reception circuit on the circuit board via the circuit pattern 5 (matching circuit) and the circuit component 6 of the RF circuit 4a and via the wiring pattern on the side surface 2d.

In the example shown in FIGS. 1A and 1B, the circuit components 6 are switching elements such as FETs, and for example, switching of the switching elements is controlled by a control circuit provided on the circuit board of the communication apparatus. On the dielectric base 2, through holes conductively connecting the switching elements and the control circuit on the circuit board are disposed. Furthermore, as shown in FIG. 1A, top electrodes 11 are connected through to the through holes.

According to the first preferred embodiment, the radiation electrodes 3a and 3b are arranged to be spaced from each other, on the substantially flat top surface 2a of the dielectric base 2, and the RF circuits 4 are arranged so as to be disposed at least partially in the gap between the radiation electrodes 3a and 3b. In other words, the radiation electrodes 3a and 3b are separated by such a space where the RF circuits 4a and 4b are partially formed, ensuring isolation between the radiation electrodes 3a and 3b. Furthermore, according to the first preferred embodiment, the portion of the dielectric base 2 between the radiation electrodes 3a and 3b is made thin due to the concavity 7, so that electromagnetic coupling between the radiation electrodes 3a and 3b is minimized. This also significantly contributes to ensure isolation between the radiation electrodes 3a and 3b.

Furthermore, because the gap between the radiation electrodes 3a and 3b is efficiently used to form the RF circuits 4, the RF circuits 4 as well as the radiation electrodes 3a and 3b are able to disposed on the dielectric base 2 while preventing any increase in the size of the dielectric base 2. Because an increase in the size of the dielectric base 2 is prevented as described above, an increase in cost is also prevented.

Furthermore, because the RF circuits 4 are disposed on the dielectric base 2 of the antenna 1, the RF circuits 4 need not be disposed on the circuit board of the communication apparatus, thereby allowing the circuit board to be made smaller and thus, reducing the size of the communication apparatus.

Furthermore, because the concavity 7 is formed in the bottom surface of the dielectric base 2, when the antenna 1 with an integral RF circuit, according to the first preferred embodiment, is mounted on the circuit board, a space surrounded by the concavity 7 of the dielectric base 2 and by the circuit board is provided. For example, circuit patterns and circuit components may be mounted to define circuits (e.g., baseband circuits conductively connected to the RF circuits 4) on a portion of the circuit board surrounded by the concavity 7, thereby highly efficiently utilizing the space defined by the concavity 7.

Accordingly, the circuits as well as the antenna 1 are capable of being disposed in an area where the antenna 1 is mounted, allowing the circuit board to be much smaller. This unique construction further facilitates reduction in the size of the communication apparatus.

Furthermore, according to the first preferred embodiment, the radiation electrodes 3 and the RF circuits 4 connected to the radiation electrodes 3 are preferably disposed on the same surface of the dielectric base 2. Thus, the radiation electrodes 3 and the RF circuits 4 are in proximity to each other, thereby reducing conduction loss.

Furthermore, according to the first preferred embodiment, the portions of the dielectric base 2 where the radiation electrodes 3 are disposed are made thick, so that the radiation electrodes 3 resonate favorably to transmit or receive radio waves with excellent sensitivity. Furthermore, the portion of the dielectric base 2 where the circuit patterns 5 of the RF circuits 4 are disposed is made thin, so that resonance of the circuit patterns 5 is prevented and minimized due to the associated portion of the dielectric base 2 being thin. Accordingly, radiation loss attributed to radiation of radio waves from the circuit patterns 5 is reduced.

As described above, conduction loss and radiation loss of the circuit patterns 5 are both reduced, thereby improving efficiency of transmission or reception by the radiation electrodes 3.

A second preferred embodiment will now be described. A communication apparatus according to the second preferred embodiment is characterized in that an antenna module to be described below is provided, and the communication apparatus, except for the antenna module, may use any construction, and thus description of the construction of the communication apparatus, except for the antenna module, will be omitted herein.

Figure 2A:
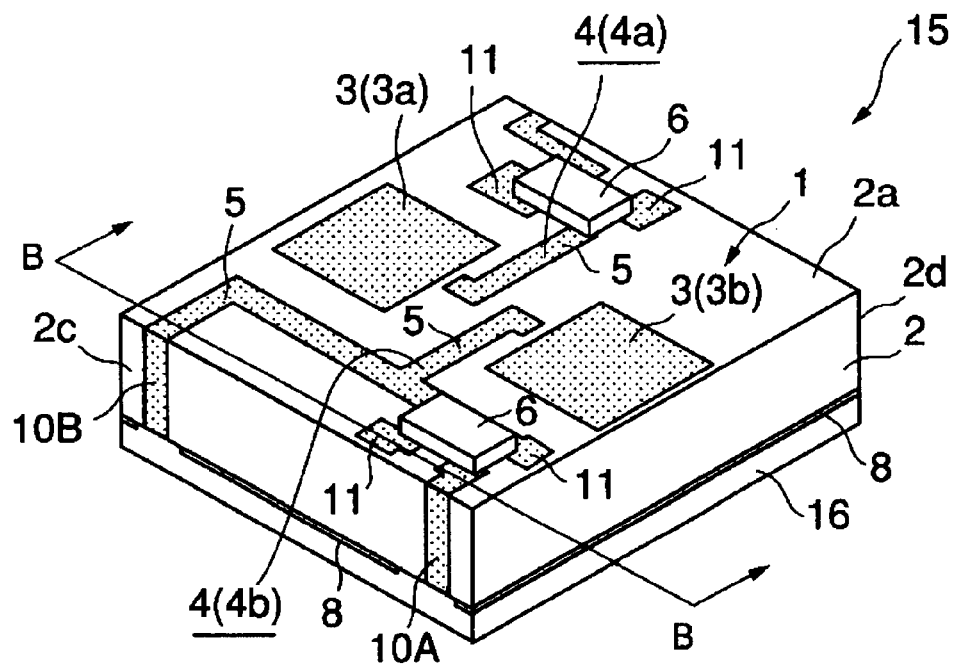
FIGS. 2A and 2B are diagrams showing an antenna module according to a second preferred embodiment of the present invention.
Figure 2B:
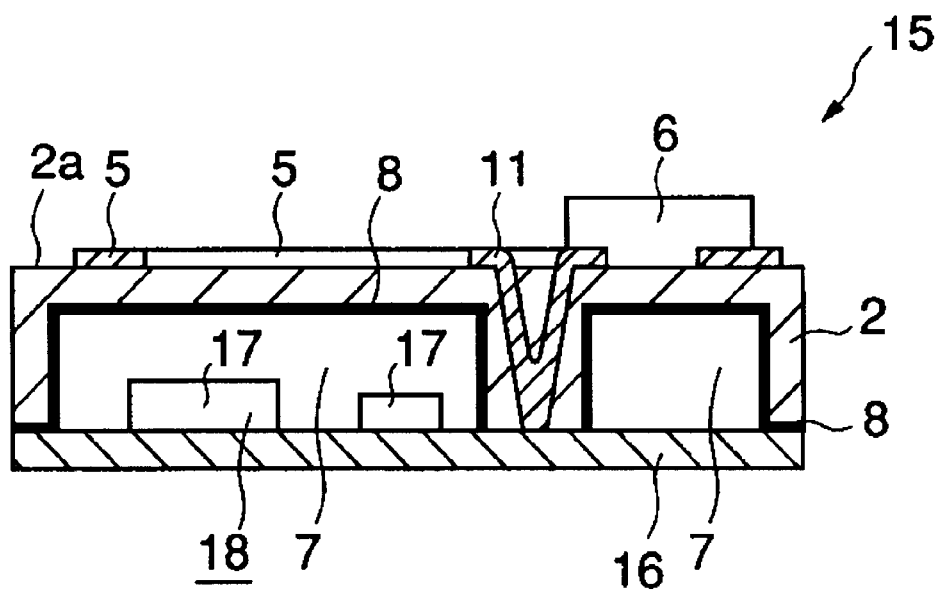

FIG. 2A is a schematic perspective view showing an example of antenna module characterizing the second preferred embodiment, and FIG. 2B is a schematic sectional view taken along B—B in FIG. 2A. In an antenna module 15 according to the second preferred embodiment, the antenna 1 with an integral RF circuit, according to the first preferred embodiment, is joined with a substrate 16, with the bottom surface of the dielectric base 2 functioning as a connecting surface. Since the construction of the antenna 1 with an integral RF circuit has been described in relation to the first preferred embodiment, repeated description of common elements will be omitted in the description of the second preferred embodiment.

On the bottom surface of the antenna 1 with an integral RF circuit, the concavity 7 is formed. Furthermore, on the substrate 16, circuit patterns (not shown) and circuit components 17 are provided to define circuits 18 in an area surrounded by the concavity 7. The circuits 18 are conductively connected to the RF circuits 4 of the antenna 1 with the integral RF circuit, via the wiring patterns 10A and 10B, etc., which constitute a connecting member.

Circuits relating to transmission or reception of radio waves include, for example, a signal processing circuit such as a baseband circuit, and a frequency conversion circuit, which is provided as required. In the second preferred embodiment, circuits selected as appropriate from those circuits are disposed on the substrate 16 to define the circuits 18.

According to the second preferred embodiment, the concavity 7 is provided on the bottom surface of the dielectric base 2 of the antenna 1 with the integral RF circuit, so that a space is formed in the bottom surface of the dielectric base 2. Thus, the antenna module 15 is constructed efficiently using the space. That is, the substrate 16 is joined with the bottom surface of the antenna 1 with an integral RF circuit, and the circuits 18 are disposed on the substrate 16, in the area surrounded by the concavity 7 on the bottom surface of the antenna 1 with the integral RF circuit. Accordingly, a compact antenna module having a very simple structure is provided.

Furthermore, because circuits such as a frequency conversion circuit and a signal processing circuit are disposed in an area where the antenna 1 with the integral RF circuit is mounted on the circuit board of the communication apparatus, an area for defining the circuits need not be provided separately from the antenna mounting area, allowing the circuit board of the communication apparatus to be made much smaller, thus facilitating reduction in the size of the communication apparatus.

Furthermore, in the antenna 1 with the integral RF circuit, the ground electrode 8 is disposed substantially over the entire inner surface of the concavity 7 of the dielectric base 2, so that the circuits 18 included in the antenna 1 are covered by the ground electrode 8. Thus, the circuits 18 included in the antenna 1 are shielded by the ground electrode 8. That is, the ground electrode 8 constitutes a shielding device for the circuits 18. Accordingly, the circuits 18 included in the antenna 1 are not susceptible to negative effects of external electromagnetic waves, and thus operation of the circuits 18 is stabilized.

The present invention is not limited to preferred embodiments described above, and may be implemented in various forms. For example, the RF circuits 4 disposed on the dielectric base 2 are not limited to specific circuit configurations, and may be implemented in any appropriate circuit configurations. Thus, for example, the circuit patterns 5 of the RF circuits 4 are not limited to the configurations shown in FIGS. 1A and 1B and FIGS. 2A and 2B. For example, the circuit patterns 5 may be conductively connected directly to the radiation electrodes 3. Furthermore, although the circuit components 6 provided on the dielectric base 2 are switching elements in the preferred embodiments described above, it is to be understood that circuit components other than switching elements may be mounted on the dielectric base 2. As described above, the shapes of circuit patterns and the types and number of circuit components disposed on the top surface of the dielectric base 2 are determined as appropriate in accordance with the circuit configurations of the RF circuits 4.

Furthermore, although the number of the radiation electrodes 3 provided on the dielectric base 2 is preferably two in the preferred embodiments described above, the number of radiation electrodes 3 may be three or larger, without limitation as long as the number is greater than one. Furthermore, although the RF circuits 4a and 4b respectively associated one to one with the radiation electrodes 3a and 3b are provided in preferred embodiments described above, for example, in the case of such an arrangement that another radiation electrode for reception is disposed on the dielectric base 2 in addition to the radiation electrode 3a for reception and the radiation electrode 3b for transmission, the radiation electrode for reception being connected to a reception circuit commonly with the radiation electrode 3a, an integral RF circuit common to these radiation electrodes for reception may be provided. As described above, RF circuits need not be provided respectively in one to one association with radiation electrodes.

Figure 3:
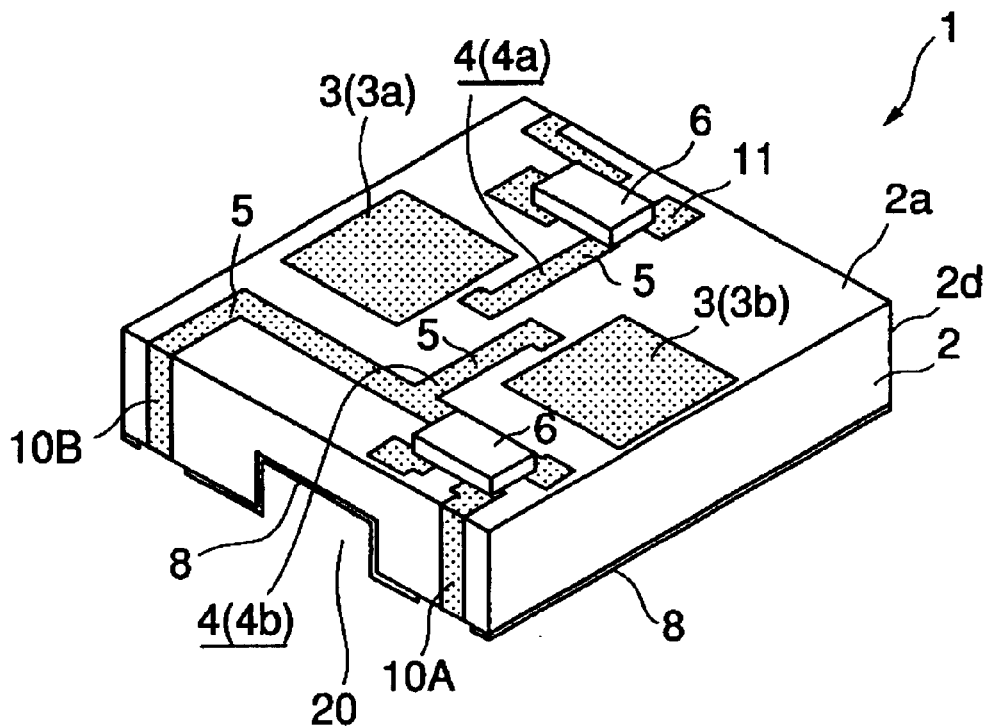
FIG. 3 is a diagram showing another preferred embodiment of the present invention.
Figure 4A:
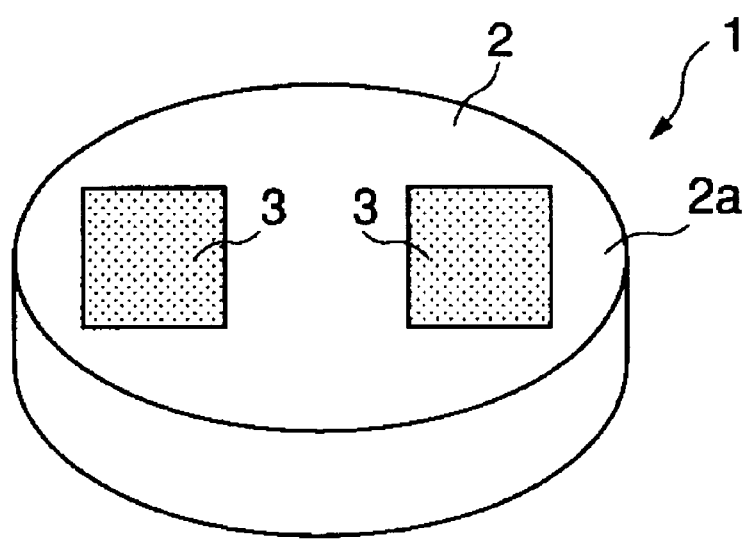
FIGS. 4A and 4B are diagrams showing still another preferred embodiment of the present invention.
Figure 4B:
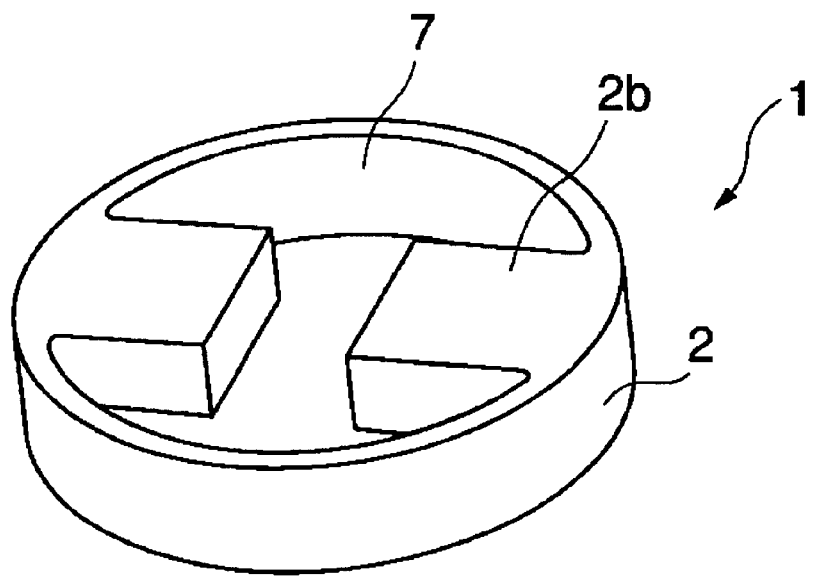

Furthermore, the dielectric base 2 is not limited to a specific shape, and may be implemented in any appropriate shape. For example, as shown in FIG. 3, an opening 20 connected through to the concavity 7 may be provided on a side surface of the dielectric base 2. Furthermore, the dielectric base 2 may be substantially cylindrical, as shown in FIG. 4A. FIG. 4B is a diagram showing the substantially cylindrical dielectric base 2 as viewed from the bottom side. As shown in FIG. 4B, no matter what the shape of the dielectric base 2 may be like, the concavity 7 is formed on the bottom surface of the dielectric base 2 so that at least portions of the dielectric base 2 where the radiation electrodes 3 are disposed will be thick.

Figure 5A:
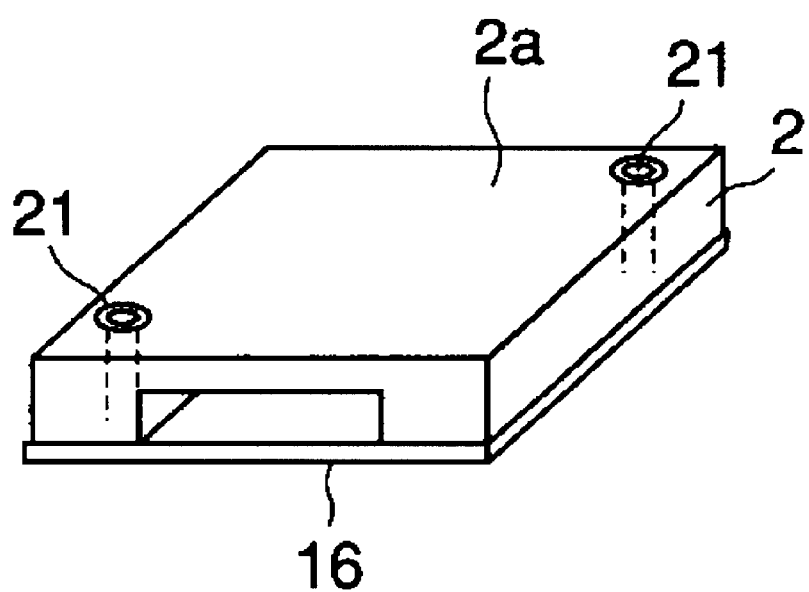
FIGS. 5A and 5B are diagrams showing yet another preferred embodiment of the present invention.
Figure 5B:
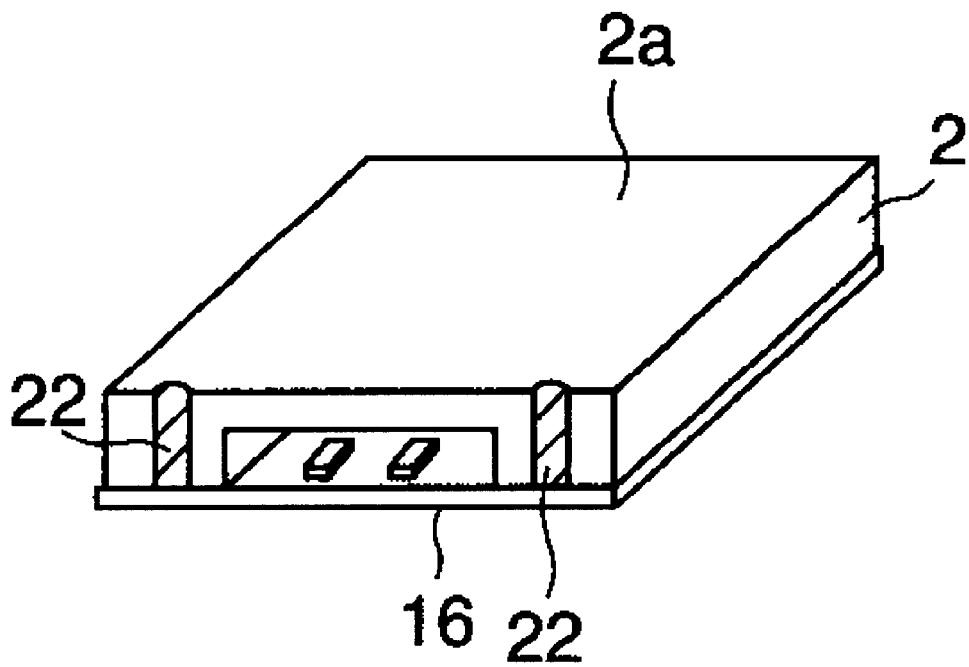
Figure 6:
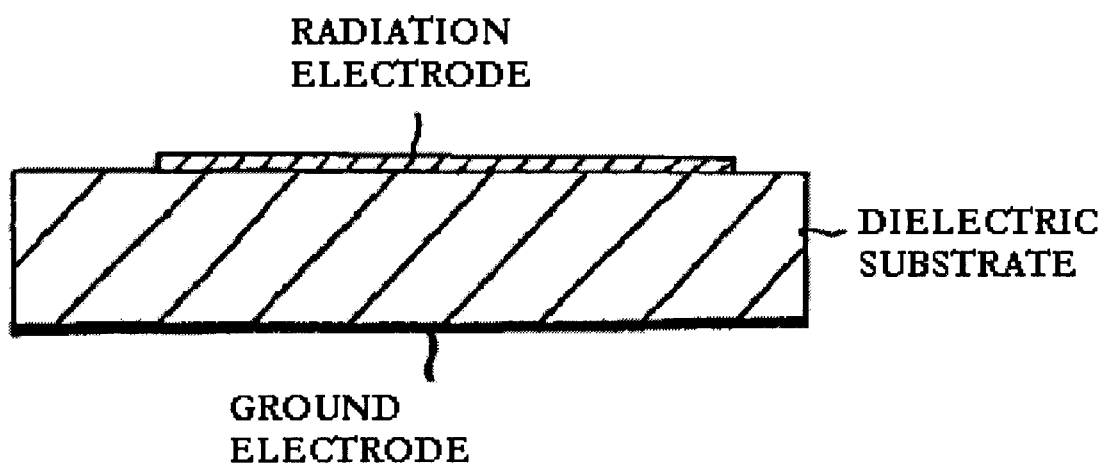
FIG. 6 is a diagram schematically showing a case where radiation electrodes are provided on a thick portion of a dielectric base.
Figure 7A:
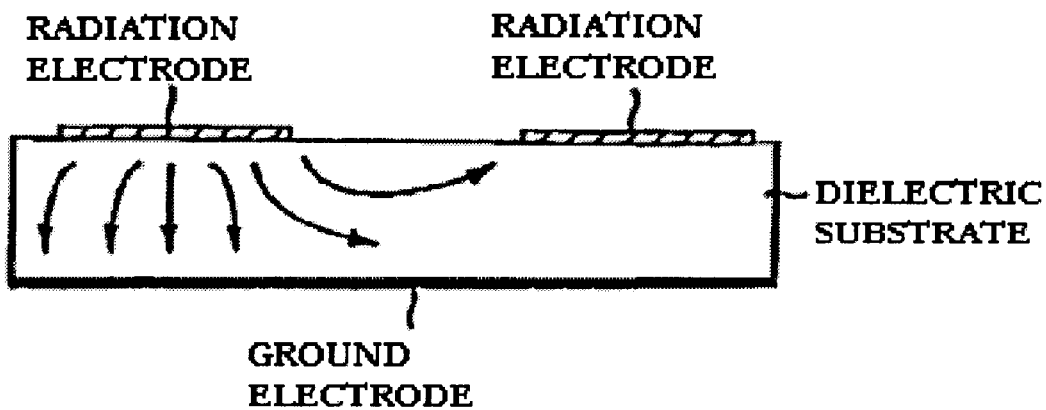
FIGS. 7A and 7B are diagrams showing the effect of a portion of the dielectric base between the radiation electrodes being made thin.
Figure 7B:
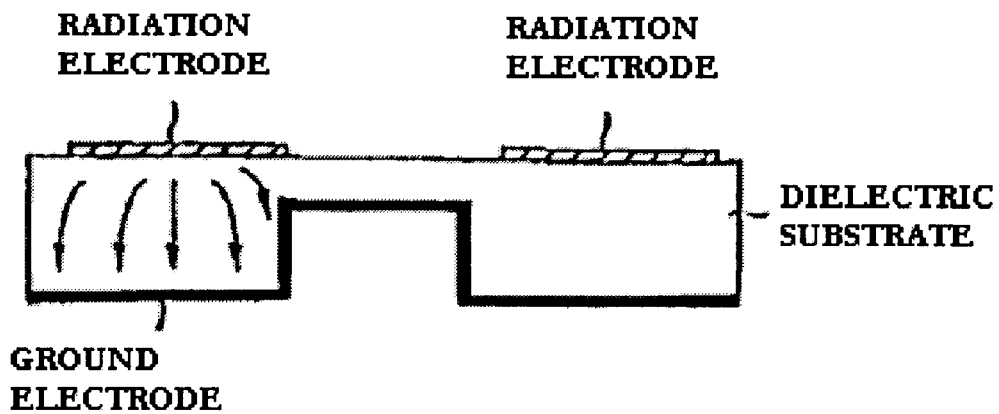

Furthermore, although the wiring patterns 10 are disposed on a side surface of the dielectric base 2 as a connecting member for connecting the RF circuits 4 disposed on the dielectric base 2 to other circuits in the preferred embodiments described above, for example, through holes may be used as a connecting member. Alternatively, as shown in FIG. 5A, metallic pins 21 disposed so as to penetrate through the dielectric base 2 from the top surface 2a to the bottom surface may be provided as the connecting member. In that case, the reliability of connection is improved as compared with a case where wiring patterns are used as the connecting member. Yet alternatively, as shown in FIG. 5B, side-surface electrodes 22 using through holes may be provided as the connecting member.

Furthermore, although a radiation electrode dedicated for reception and a radiation electrode dedicated for transmission are provided on the dielectric base 2 in the preferred embodiments described above, all of a plurality of radiation electrodes disposed on the dielectric base 2 may be dedicated for reception or dedicated for transmission, or used both for transmission and reception. Furthermore, a radiation electrode dedicated for reception, a radiation electrode dedicated for transmission, and a radiation electrode for both transmission and reception may be combined as appropriate.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An antenna with an integral RF circuit, comprising:
   a dielectric base having a bottom surface and a top surface that is substantially flat;
   a plurality of radiation electrodes for at least one of transmission and reception of a radio wave, disposed on the top surface of the dielectric base and spaced from each other;
   an RF circuit having a circuit pattern and connected to at least one of the plurality of radiation electrodes conductively or via a capacitor, the RF circuit being disposed at least partially in a gap between the plurality of radiation electrodes;
   a concavity formed in the bottom surface of the dielectric base in a region corresponding to an area where the circuit pattern of the RF circuit is located, the concavity defining a thin portion and a thick portion in the dielectric base, the circuit pattern of the RF circuit being disposed on the thin portion of the dielectric base and the plurality of radiation electrodes being disposed on the thick portion of the dielectric base; and
   a ground electrode disposed on the bottom surface of the dielectric base and on an inner surface of the concavity.

2. An antenna according to claim 1, wherein each of the plurality of radiation electrodes has a different resonant frequency from that of the others of the plurality of radiation electrodes.

3. An antenna according to claim 1, wherein the plurality of radiation electrodes disposed on the top surface of the dielectric base includes at least one radiation electrode dedicated for reception and at least one radiation electrode dedicated for transmission.

4. An antenna according to claim 1, wherein the RF circuit is provided in one-to-one association with each of the plurality of radiation electrodes.

5. An antenna according to claim 1, further comprising a plurality of the RF circuits disposed partially in the gap between the plurality of radiation electrodes and a circuit pattern defining a matching circuit disposed between the plurality of RF circuits.

6. An antenna according to claim 5, wherein the matching circuit is at least partially located in the gap between the plurality of radiation electrodes.

7. An antenna according to claim 5, wherein the matching circuit includes switching elements.

8. A communication apparatus comprising an antenna with an integral RF circuit according to claim 1.

9. An antenna module comprising:
   a substrate;
   an antenna with an integral RF circuit including:
      a dielectric base having a bottom surface and a top surface that is substantially flat;
      a plurality of radiation electrodes for at least one of transmission and reception of a radio wave, disposed on the top surface of the dielectric base and spaced from each other;
      an RF circuit having a circuit pattern and connected to at least one of the plurality of radiation electrodes conductively or via a capacitor, the RF circuit being disposed at least partially in a gap between the plurality of radiation electrodes;
      a concavity formed in the bottom surface of the dielectric base in a region corresponding to an area where the circuit pattern of the RF circuit is located, the concavity defining a thin portion and a thick portion in the dielectric base, the circuit pattern of the RF circuit being disposed on the thin portion of the dielectric base and the plurality of radiation electrodes being disposed on the thick portion of the dielectric base; and
      a ground electrode disposed on the bottom surface of the dielectric base and on an inner surface of the concavity;
      wherein the antenna is joined to the substrate with the bottom surface thereof functioning as a connecting surface;
   a circuit conductively connected to the RF circuit of the antenna and disposed in an area on the substrate surrounded by the concavity on the bottom surface of the antenna; and
   a connecting member for conductively connecting the circuit and the RF circuit.

10. An antenna module according to claim 9, wherein the connecting member includes a through hole disposed in the dielectric base of the antenna.

11. An antenna module according to claim 9, wherein the connecting member includes a wiring pattern disposed on a side surface of the dielectric base of the antenna.

12. An antenna module according to claim 9, wherein the connecting member includes a metallic pin disposed so as to penetrate through the dielectric base of the antenna from the top surface to the bottom surface.

13. An antenna module according to claim 9, wherein each of the plurality of radiation electrodes has a different resonant frequency from that of the others of the plurality of radiation electrodes.

14. An antenna module according to claim 9, wherein the plurality of radiation electrodes disposed on the top surface of the dielectric base includes at least one radiation electrode dedicated for reception and at least one radiation electrode dedicated for transmission.

15. An antenna module according to claim 9, wherein the RF circuit is provided in one-to-one association with each of the plurality of radiation electrodes.

16. An antenna module according to claim 9, further comprising a plurality of the RF circuits disposed partially in the gap between the plurality of radiation electrodes and a circuit pattern defining a matching circuit disposed between the plurality of RF circuits.

17. An antenna module according to claim 16, wherein the matching circuit is at least partially located in the gap between the plurality of radiation electrodes.

18. An antenna module according to claim 16, wherein the matching circuit includes switching elements.

* * * * *